(12) United States Patent
Menacher

(10) Patent No.: US 9,929,705 B2
(45) Date of Patent: Mar. 27, 2018

(54) TRANSCONDUCTANCE AMPLIFIER HAVING LOW DISTORTION

(71) Applicant: Fluke Corporation, Everett, WA (US)

(72) Inventor: David J. Menacher, Seattle, WA (US)

(73) Assignee: Fluke Corporation, Everett, WA (US)

( * ) Notice: Subject to any disclaimer, the term of this patent is extended or adjusted under 35 U.S.C. 154(b) by 6 days.

(21) Appl. No.: 15/162,963

(22) Filed: May 24, 2016

(65) Prior Publication Data

US 2017/0346454 A1   Nov. 30, 2017

(51) Int. Cl.
*H03F 3/45*   (2006.01)
*H03F 3/21*   (2006.01)

(52) U.S. Cl.
CPC ......... *H03F 3/45174* (2013.01); *H03F 3/21* (2013.01); *H03F 3/45273* (2013.01); *H03F 2200/93* (2013.01); *H03F 2203/45112* (2013.01); *H03F 2203/45146* (2013.01); *H03F 2203/45202* (2013.01); *H03F 2203/45288* (2013.01)

(58) Field of Classification Search
CPC .............................. H03F 3/45174; H03F 3/21
USPC ........................................................ 330/288
See application file for complete search history.

(56) References Cited

U.S. PATENT DOCUMENTS

| | | | |
|---|---|---|---|
| 3,898,578 A * | 8/1975 | Fletcher | H03F 3/3077 330/253 |
| 5,945,842 A * | 8/1999 | Sugawara | H03K 19/00376 326/31 |
| 5,973,563 A | 10/1999 | Seven | |
| 6,011,415 A * | 1/2000 | Hahn | G11B 5/5582 327/103 |
| 6,411,164 B1 | 6/2002 | Enriquez | |
| 6,731,165 B1 | 5/2004 | Marz | |
| 2009/0302825 A1* | 12/2009 | Hsieh | G05F 3/24 323/315 |
| 2011/0115530 A1* | 5/2011 | Ohara | G05F 1/573 327/103 |

FOREIGN PATENT DOCUMENTS

WO    96/27238 A1    9/1996

OTHER PUBLICATIONS

Fluke Calibration "5522A Multi-Product Calibrator" © 1995-2016 Fluke Corporation, 5 pgs.
Wikipedia "Bipolar junction transistor" downloaded Feb. 12, 2016, http://en.wikipedia.org/wiki/Bipolar_junction_transistor, 20 pgs.
Wikipedia "Current mirror" downloaded Feb. 12, 2016, https://en.wikipedia.org/wiki/Current_mirror, 11 pgs.
European Search Report for Application No. EP 17 17 2869.4, dated Sep. 29, 2017, 8 pages.

* cited by examiner

*Primary Examiner* — Patricia T Nguyen
(74) *Attorney, Agent, or Firm* — Seed IP Law Group LLP

(57) ABSTRACT

A low distortion transconductance amplifier provides current to a grounded load using a virtual ground input stage, a pair of current mirrors, and a bias current source. The virtual ground input stage may include transistors arranged as a Darlington pair. The low distortion transconductance amplifier can function as a voltage-controlled AC current source that is operable at high frequencies.

23 Claims, 11 Drawing Sheets

US 9,929,705 B2

TRANSCONDUCTANCE AMPLIFIER HAVING LOW DISTORTION

BACKGROUND

Technical Field

The present disclosure generally relates to precision transconductance amplifiers for use in electronic circuits.

Description of the Related Art

Some amplifiers used in electrical circuits are voltage amplifiers having an input voltage and a corresponding output voltage that is greater than the input voltage by a gain factor. Other amplifiers used in electrical circuits are current amplifiers having an input current and a corresponding output current that is greater than the input current by a gain factor. Still other amplifiers used in electrical circuits are transconductance amplifiers having an input voltage and a corresponding output current, or transresistance amplifiers having an input current and a corresponding output voltage. In addition to applying a gain, the transconductance and transresistance amplifiers provide a voltage-to-current or current-to-voltage conversion function, respectively.

Such a conversion function can be implemented in several ways. For example, when a resistor is connected between a DC voltage source, V, and ground, a current, I, flows through the resistor. Therefore, the resistor can be thought of as a device that converts a voltage to a current, wherein the output current is proportional to the applied input voltage, according to Ohm's law: I=V/R, or I=GV. When a voltage source connected to a resistor is further connected in series with an amplifier stage, the result is a transconductance amplifier. Like a resistor, a transconductance amplifier also outputs a current that is proportional to its input voltage. The amplifier stage can be, for example, a transistor, an operational amplifier ("op-amp") or an arrangement of transistors. The resulting transconductance amplifier provides a voltage-controlled current source for use in electronic circuits, as is known in the art.

Transconductance refers to conductance across a direct current (DC) device, that is, the conductance between the input and the output of the device. Conductance, G, is defined as the reciprocal of resistance in a DC circuit: G (mhos)=1/R ($\Omega$). The term "admittance" refers to conductance in an alternating current (AC) circuit, or the reciprocal of impedance: Y (mhos)=1/Z ($\Omega$), as is well known in the art. The AC equivalent of transconductance is then transadmittance.

A Darlington pair is known in the art of circuit design as a pair of bipolar transistors in which the output current of the first transistor is further amplified by the second transistor. A Darlington pair thus behaves as a single transistor with a high current gain, approximately equal to the square of the gain of a single transistor. A disadvantage of a Darlington pair is that it tends to become unstable at high frequencies, so its operational bandwidth is limited.

A current mirror is known in the art of circuit design as an electrical circuit that can be used to provide a bias current to a load. A current mirror can be thought of as a current-controlled current source.

BRIEF SUMMARY

A low distortion transconductance amplifier provides current to a grounded load using a virtual ground input stage, a pair of current mirrors, and a bias current source. The virtual ground input stage may include transistors arranged as a Darlington pair. The low distortion transconductance amplifier can function as a voltage-controlled AC current source that is operable at high frequencies.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "In an embodiment" or "in an embodiment" in various places throughout the specification are not necessarily all referring to the same embodiment. Furthermore, the particular features, structures, or characteristics may be combined in any suitable manner in one or more aspects of the present disclosure.

In the figures, identical reference numbers identify similar features or elements. The sizes and relative positions of the features in the figures are not necessarily drawn to scale. Furthermore, specific embodiments are described herein with reference to exemplary transconductance amplifier circuits. The present disclosure and the reference to certain materials, dimensions, and the details and ordering of method steps should not be limited to those shown.

Figure 1:
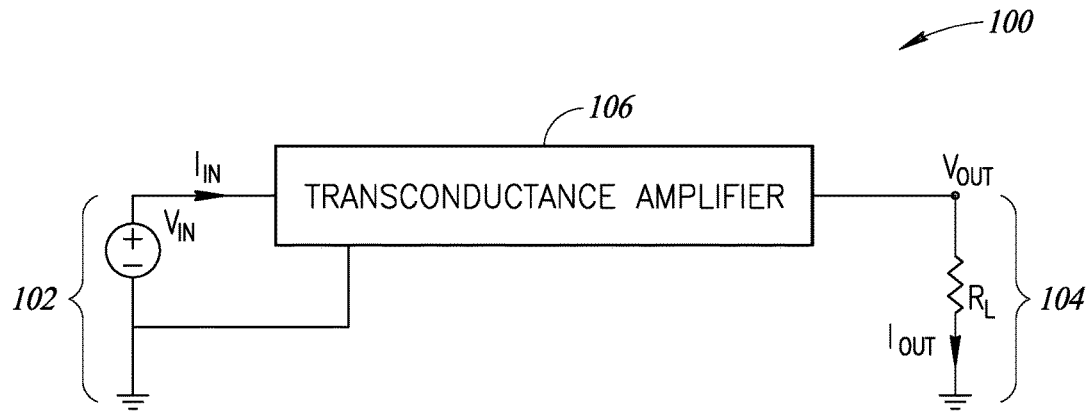
FIG. 1 is a high level schematic of a basic transconductance amplifier circuit, according to the prior art.

FIG. 1 shows a known generic transconductance amplifier circuit 100. The transconductance amplifier circuit 100 includes an input stage 102, an output stage 104, and a transconductance amplifier 106. The transconductance amplifier circuit 100 can be thought of as a voltage-controlled current source that produces an output current $I_{out}$ in response to $V_{in}$. The output stage 104 includes a load resistor $R_L$, through which the output current $I_{out}$ flows to ground. The relationship between the input voltage and the output current is $$I_{out} = g_m V_{in}.$$

wherein $g_m$ is the gain of the transconductance amplifier 106. Embodiments described herein present various configurations for the transconductance amplifier 106.

Figure 2:
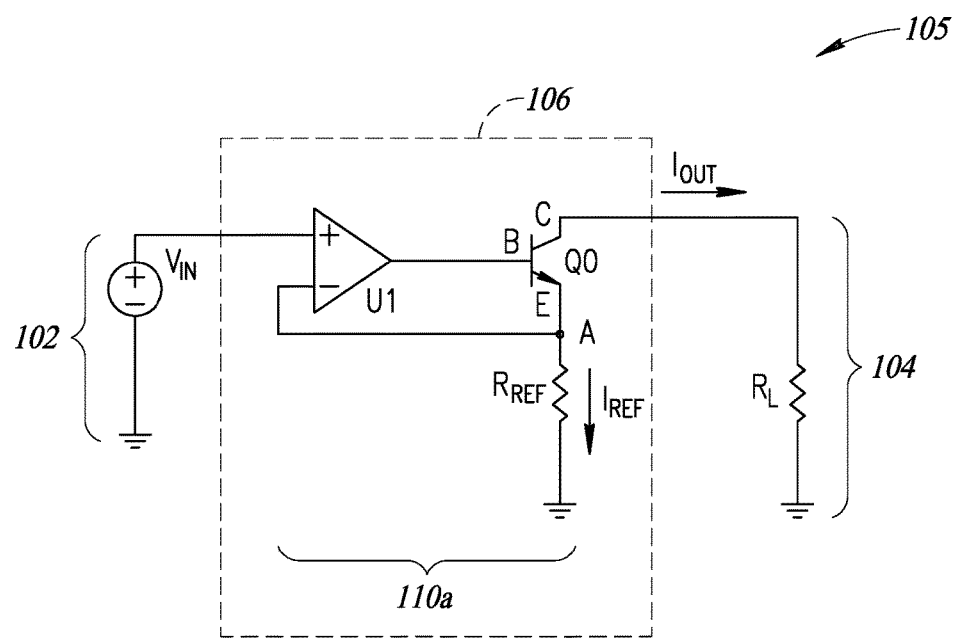
FIG. 2 is a schematic of a transconductance amplifier circuit according to the prior art.

FIG. 2 shows a known transconductance amplifier circuit 105. The transconductance amplifier circuit 105 includes the input stage 102 and the output stage 104 having a grounded load. In the transconductance amplifier circuit 105, the input stage 102 further includes an op-amp U1, an NPN bipolar junction transistor (BJT) Q0, and a precision reference resistor $R_{ref}$. The NPN transistor Q0 has emitter, collector, and base terminals as is known in the art. The op-amp U1 has positive and negative input terminals and an output terminal, as is known in the art. In the transconductance amplifier circuit 105, $V_{in}$ is coupled directly to the positive terminal of U1, and $R_{ref}$ is coupled to the negative terminal of U1 at a node A. The output of U1 is coupled to the base of Q0. The emitter terminal of Q1 is coupled to node A. If the current gain of Q0 is large enough, $$I_{out} = -I_{ref} = -V_{in}/R_{ref}.$$

The gain of the transconductance amplifier 106 is then $$g_m = -1/R_{ref}.$$

Existing transconductance amplifiers capable of converting a single-ended input voltage to a single-ended ground-referenced output current typically use op-amp based voltage-to-current converters such as the one shown in FIG. 2. However, such amplifiers have limitations on the load $R_L$. In practice, a grounded load is not possible due to input range and output range limitations illustrated by the following example. It is noted that $V_{in}$ must be positive for Q1 to be in forward active mode ($V_{be} \geq 0.7V$ and $V_{ce} \geq 0.2V$). The restriction $V_{in} \geq 0$ means $I_{out} \geq 0$. Furthermore, $V_{out} = V_{in} + V_{ce}$. Therefore, $V_{out} \geq V_{in} + 0.2V$, which requires that $R_L < 0$.

Figure 3:
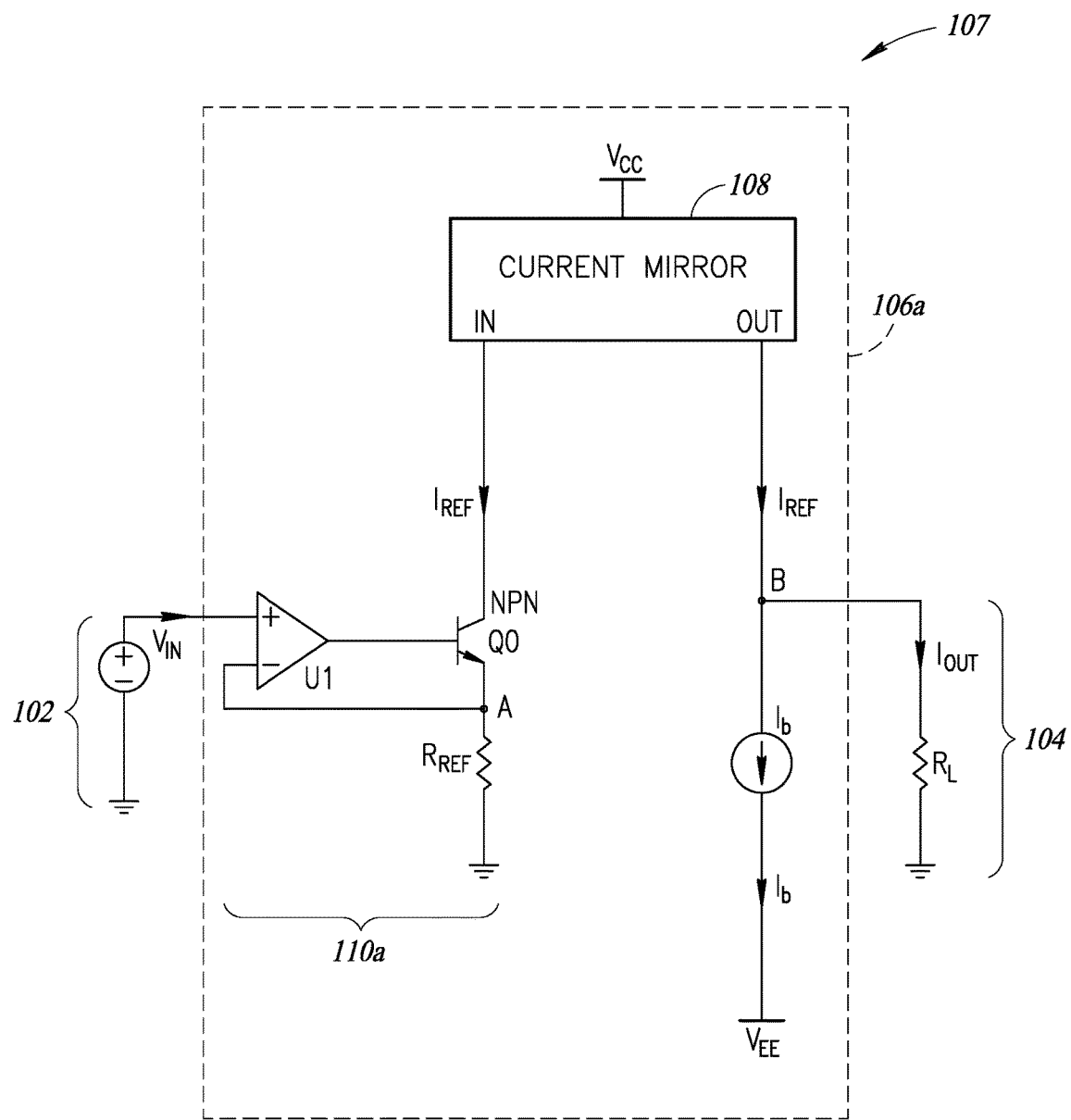
FIG. 3 is a schematic of a transconductance amplifier circuit that includes a current mirror and a virtual ground input stage, according to the prior art.

FIG. 3 shows a known transconductance amplifier circuit 107. The transconductance amplifier circuit 107 overcomes some limitations of the conventional transconductance amplifier circuit 105 of FIG. 2 by adding a current mirror 108 and a current source $I_b$ for delivering current to grounded loads. The bias current $I_b$ is coupled to a negative supply voltage $V_{ee}$. In the transconductance amplifier circuit 107, the output stage 104 is grounded.

The current mirror 108 is coupled to a power supply $V_{cc}$. When the transistor Q0 switches on, a current $I_{ref}$ at the input is "mirrored" at the output of the current mirror 108. That is, the current mirror 108 responds to an input current by delivering an equivalent output current. This means that whichever current exits the input terminal of the current mirror 108 also exits the output terminal of the current mirror 108. The current mirror 108 has the effect of pushing current into the load $R_L$ as opposed to pulling current from the load.

In the transconductance amplifier circuit 107, a transconductance amplifier 106a further includes the conventional op-amp stage 110a as shown in FIG. 2. The op-amp stage 110a includes the operational amplifier U1, the NPN transistor Q0, and the reference resistor $R_{ref}$. The negative terminal of the op-amp U1 is coupled to ground via $R_{ref}$. The output of U1 is coupled to the base terminal of Q0 and the emitter terminal of Q0 is coupled to the negative input of U1, such that $I_{ref} = V_{in}/R_{ref}$. Adding the current source $I_b$ changes the transconductance gain relationship to be:

$$I_{out} = -g_m V_{in} - I_b.$$

The current source $I_b$ can be designed to ensure that the transconductance amplifier 107 delivers negative output current to an arbitrary load. This eliminates the limitation $I_{out} \geq 0$. However, when $I_{out} = 0$, the input voltage is non-zero, i.e., a DC bias is applied: $V_{in} = I_b R_{ref}$. The need for a DC bias at the input of a transconductance amplifier can be a disadvantage. First, additional circuitry is required to provide the DC bias at the input. Second, adding a DC bias voltage at the input of an amplifier reduces the amount of signal headroom in the direction of the DC bias. Third, operating an amplifier near a power rail ($V_{cc}$ or $V_{ee}$) introduces distortion.

Figure 4:
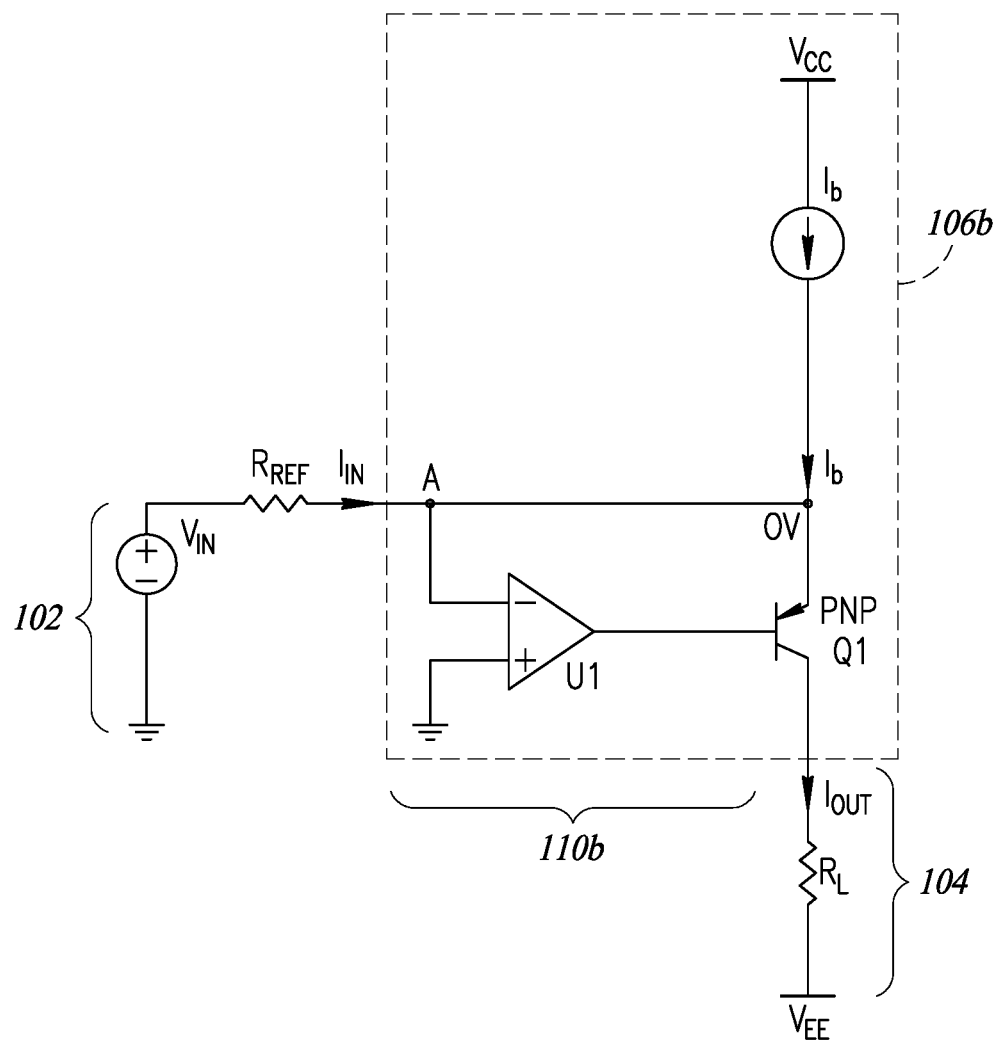
FIG. 4 is a circuit schematic of a virtual ground input stage suitable for use in a transconductance amplifier, according to an embodiment as described herein.

FIG. 4 shows a virtual ground input stage 110b suitable for use in a low distortion transconductance amplifier 106b, according to an embodiment of the present disclosure. The transconductance amplifier 106b, shown enclosed by a dotted line, includes the virtual ground input stage 110b and the bias current source $I_b$. The virtual ground input stage 110b provides a current bias as a substitute for a DC bias voltage at the input stage, thus circumventing the problems described above that are associated with such a DC bias voltage. In the input stage 102, the voltage source $V_{in}$ is applied across a precision reference resistor $R_{ref}$ to produce an input current $I_{in}$ at an input node A. Instead of biasing Q1 using an input bias voltage, the current source $I_b$ is coupled to the emitter of Q1 and drives current through Q1. $I_b$ is desirably several times larger than the absolute value of the largest possible input current.

The virtual ground input stage 110b includes the op-amp U1 and a PNP transistor Q1. In a conventional op-amp implementation, an op-amp functions as a differential amplifier that boosts a voltage between the positive and negative input terminals by drawing energy from the power supply $V_{cc}$. However, the op-amp U1 is not used as an amplifier in the virtual ground input stage 110b. Instead, the op-amp U1 is used to establish a virtual ground at input node A, below a bias resistor $R_B$. Thus, U1 is coupled in a negative feedback configuration. It is noted that the bias resistor $R_B$, not shown, sets the bias current to a desired value, and is represented in the Figures herein as an ideal current source instead of a resistor. Consequently, the output terminal of U1 will settle to whatever voltage is necessary to force the positive and negative inputs of U1 to be at substantially the same voltage, $V_{in} = I_{in} R_{ref}$. The output voltage of U1 is variable, and adjusts itself so as to force the differential voltage between the input terminals of U1 to be substantially zero. Because the positive input of U1 is grounded, the negative input is also held at 0V, which effectively grounds the input node A. Because the negative terminal of U1 is electrically isolated from ground, it is referred to as a "virtual ground." The bias current $I_b$ flows from the power supply $V_{cc}$ through the bias resistor $R_B$. The output stage 104 is coupled to the negative power supply $V_{ee}$. When Q1 is switched on, $I_{out}=I_b+I_{in}$. The input current $I_{in}$ flows around U1 to the grounded node A and enters the emitter of Q1 where it is then delivered to the load $R_L$. Use of the virtual ground input stage 110b will still require additional circuitry to deliver current to a grounded load. However, because an input current is used instead of a DC bias input voltage, the input stage has lower distortion and better noise performance. Additional zeroing circuitry is also not needed at the input. Furthermore, the virtual ground input stage 110b is able to handle input voltages of both positive and negative polarity.

Figure 5:
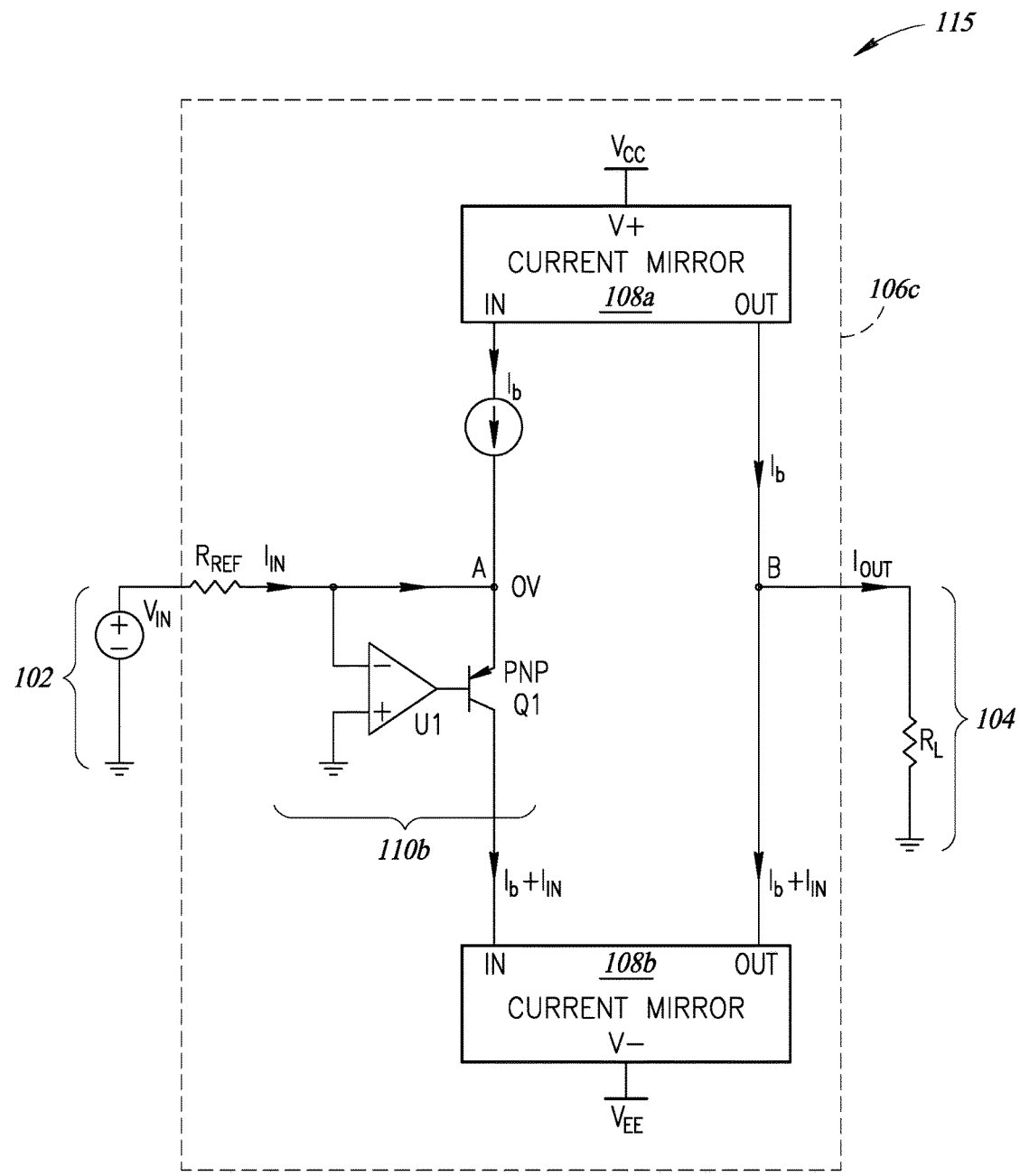
FIG. 5 is a high level schematic of a transconductance amplifier circuit that includes two current mirrors and a virtual ground input stage, according to an embodiment as described herein.

FIG. 5 shows a low distortion transconductance amplifier circuit 115, according to an embodiment of the present disclosure. In the low distortion transconductance amplifier circuit 115, the transconductance amplifier 106c, shown enclosed by a dotted line, includes the virtual ground input stage 110b and two current mirrors 108a, 108b. By adding the current mirrors 108a, 108b to the circuit, the output current can be driven to a grounded load without the bias current $I_b$ being delivered to the load.

In the input stage 102, the voltage source $V_{in}$ is applied across the precision reference resistor $R_{ref}$ to produce the input current $I_{in}$ at the input node A. Also delivered to the input node A is the bias current $I_b$ drawn from the current mirror 108a. The current mirror 108a is coupled to the positive supply voltage $V_{cc}$ and the current mirror 108b is coupled to the negative supply voltage $V_{ee}$. The virtual ground input stage 110b includes the op-amp U1 and the PNP transistor Q1. Establishing a virtual ground below $R_b$ draws current from $V_{cc}$ through the current mirror 108a. $I_{out}$ is then equal to the difference between the top and bottom bias currents at output node B:

$$I_{out}=I_b-(I_b+I_{in})=-V_{in}/R_{ref}$$

When the current through the top and bottom current mirrors is equal, $I_{out}=0$. However, when the currents are not precisely mirrored, excess current is directed to the load $R_L$. In the transconductance amplifier circuit 115, the output stage 104 is grounded.

Figure 6:
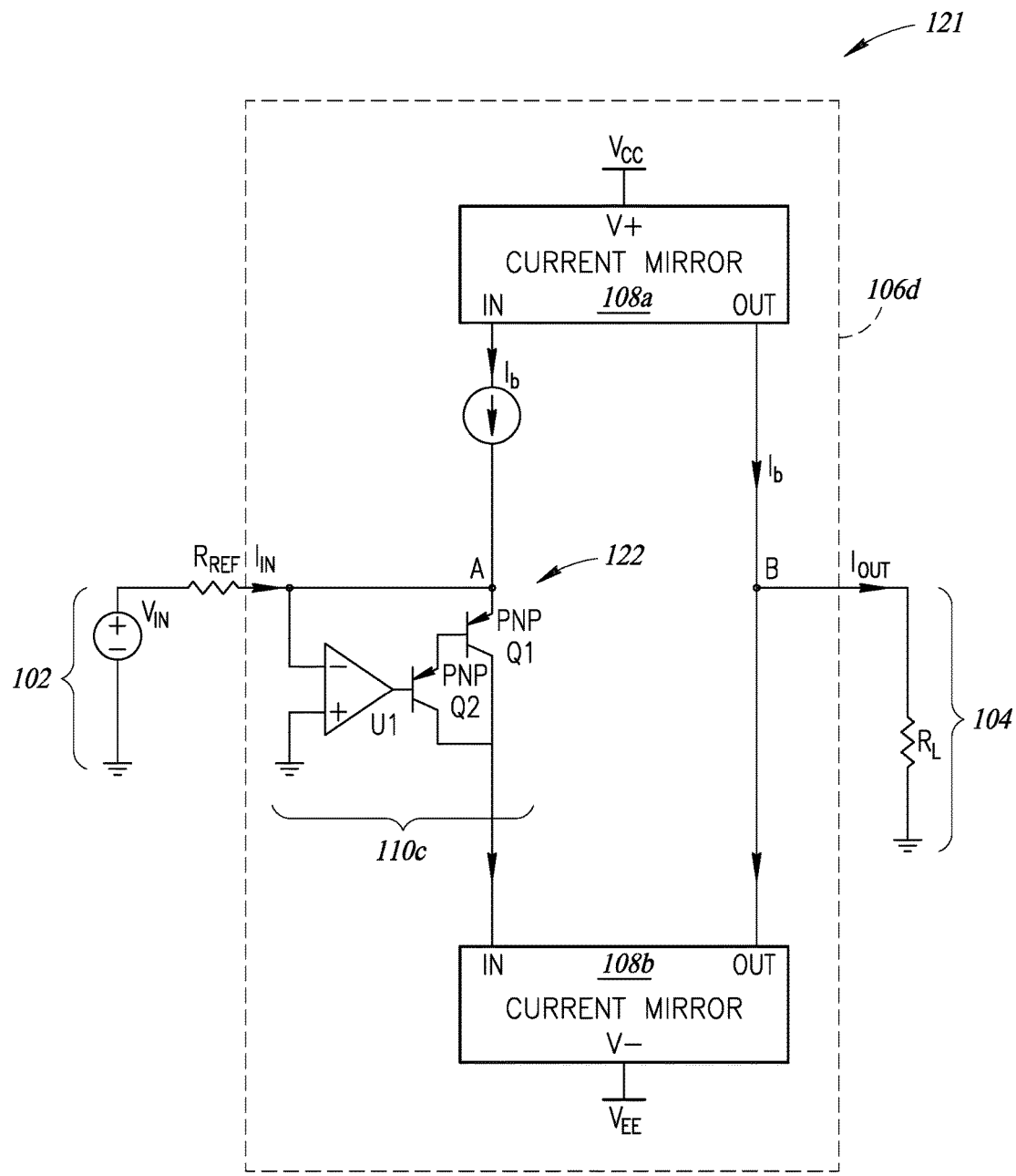
FIG. 6 is a schematic of a transconductance amplifier circuit implemented with a Darlington pair, according to an embodiment as described herein.

FIG. 6 shows a low distortion transconductance amplifier circuit 121, according to an embodiment of the present disclosure. In the low distortion transconductance amplifier circuit 121, the transconductance amplifier 106d, shown enclosed by a dotted line, includes a virtual ground input stage 110c and the two current mirrors 108a, 108b. In the input stage 102, the voltage source $V_{in}$ is applied across the precision reference resistor $R_{ref}$ to generate a current source $I_{in}$ at the input node A. $V_{in}$ can be an AC or a DC source. Also delivered to the input node A is the bias current $I_b$ drawn from the current mirror 108a. The current mirror 108a is coupled to the positive supply voltage $V_{cc}$ and the current mirror 108b is coupled to the negative supply voltage $V_{ee}$. The op-amp U1 drives the transistor Q2. In the transconductance amplifier circuit 121, the output stage 104 is grounded.

The right side of $R_{ref}$ is connected to the negative terminal of U1. The positive terminal of U1 is connected to ground. The output of U1 forces the negative terminal of U1 to be the same as the positive terminal, that is, a "virtual ground" is created at the negative terminal of U1 so that the differential voltage across the inputs to the op-amp U1 is zero. Thus, node A is grounded.

The virtual ground input stage 110c includes the op-amp U1 and a Darlington pair 122 of PNP transistors, Q1 and Q2. A bias current flows from $V_{CC}$ down through $R_b$ and into the Darlington pair, Q1 and Q2. In one embodiment, the Darlington pair has unity gain, i.e., no amplification. Therefore, in such embodiment, Q1 and Q2 could alternatively be replaced by a single transistor. Currents flowing out of the top current mirror 108a, $I_b$, are equal. Likewise, currents flowing into the bottom current mirror 108b are also equal. In each one of Q1 and Q2, the arrow side is the emitter and the other side is the collector.

Figure 7:
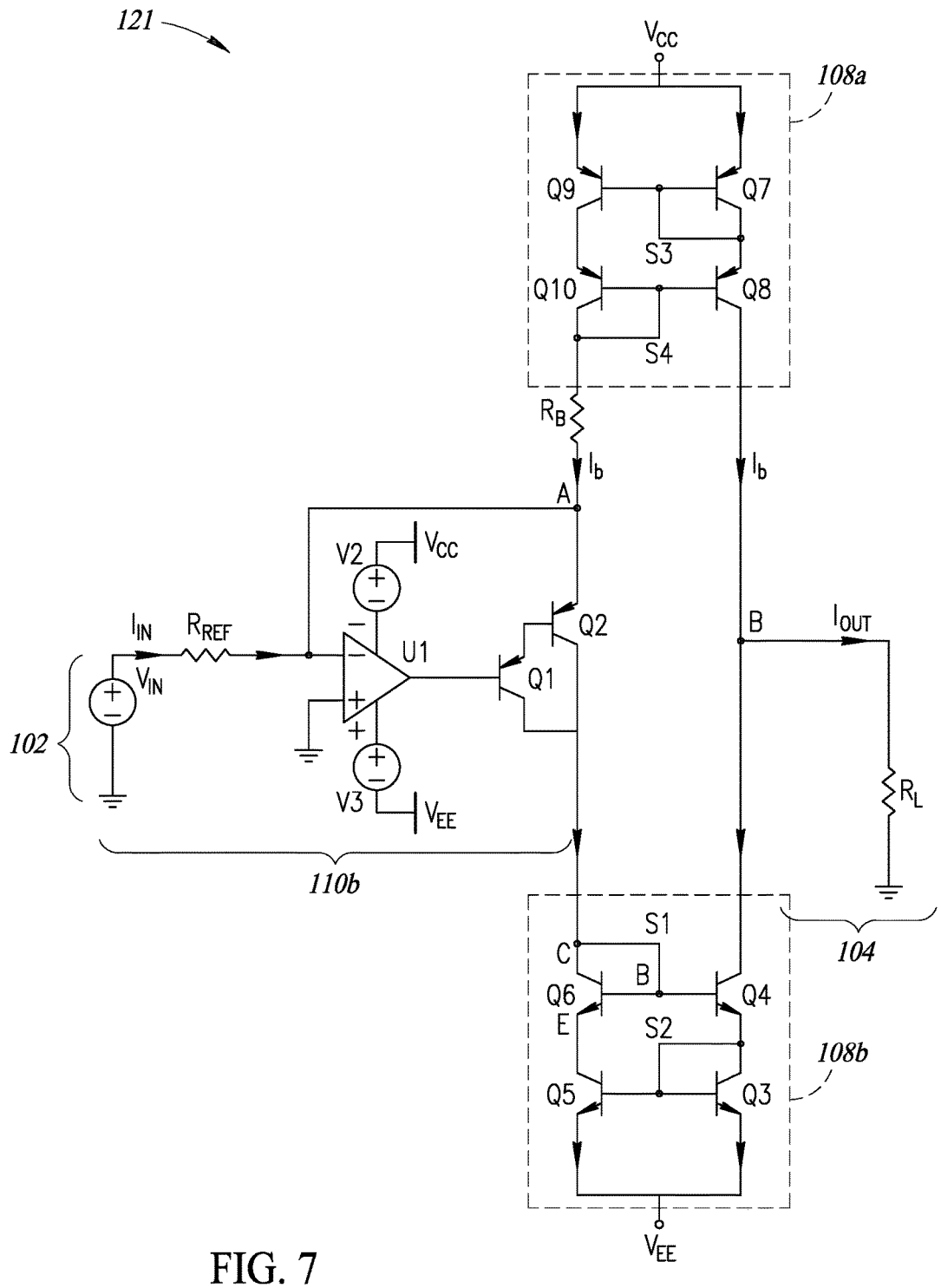
FIG. 7 is a detailed schematic of the transconductance amplifier circuit shown in FIG. 6.

FIG. 7 shows the low distortion transconductance amplifier circuit 121 of FIG. 6 in greater detail. The input stage 102 includes the voltage source $V_{in}$ and the resistor $R_{ref}$. The op-amp U1 is shown coupled between the power supplies $V_{cc}$ and $V_{ee}$. The virtual ground input stage 110c may further include a voltage source V2 coupled between U1 and $V_{cc}$, and a voltage source V3 coupled between U1 and $V_{ee}$. The current mirrors 108a, 108b include bipolar junction transistors (BJTs) arranged in a lower transistor array corresponding to the current mirror 108b and an upper transistor array corresponding to the current mirror 108a. The current mirrors 108a, 108b are powered by voltage supplies $V_{cc}$ and $V_{ee}$, respectively. The lower current mirror 108b includes four BJTs, Q3, Q4, Q5, and Q6. Each BJT is a three-terminal device having an emitter, a base, and a collector. Exemplary labels are provided on the terminals of Q6 in FIG. 7. The base and the collector of Q6 are coupled together by a short circuit connection S1. The base and the collector of Q3 are coupled together by a short circuit connection S2. The upper current mirror 108a includes four BJTs, Q7, Q8, Q9, and Q10. The base and the collector of Q7 are coupled together by a short circuit connection S3. The base and the collector of Q10 are coupled together by a short circuit connection S4. Conventional op-amp based current mirrors have low frequency poles whereas the BJT current mirrors shown in FIG. 7 have high frequency poles. Hence, through the use of BJTs, the bandwidth of the current mirrors 108a, 108b is shifted to higher frequencies.

Figure 8:
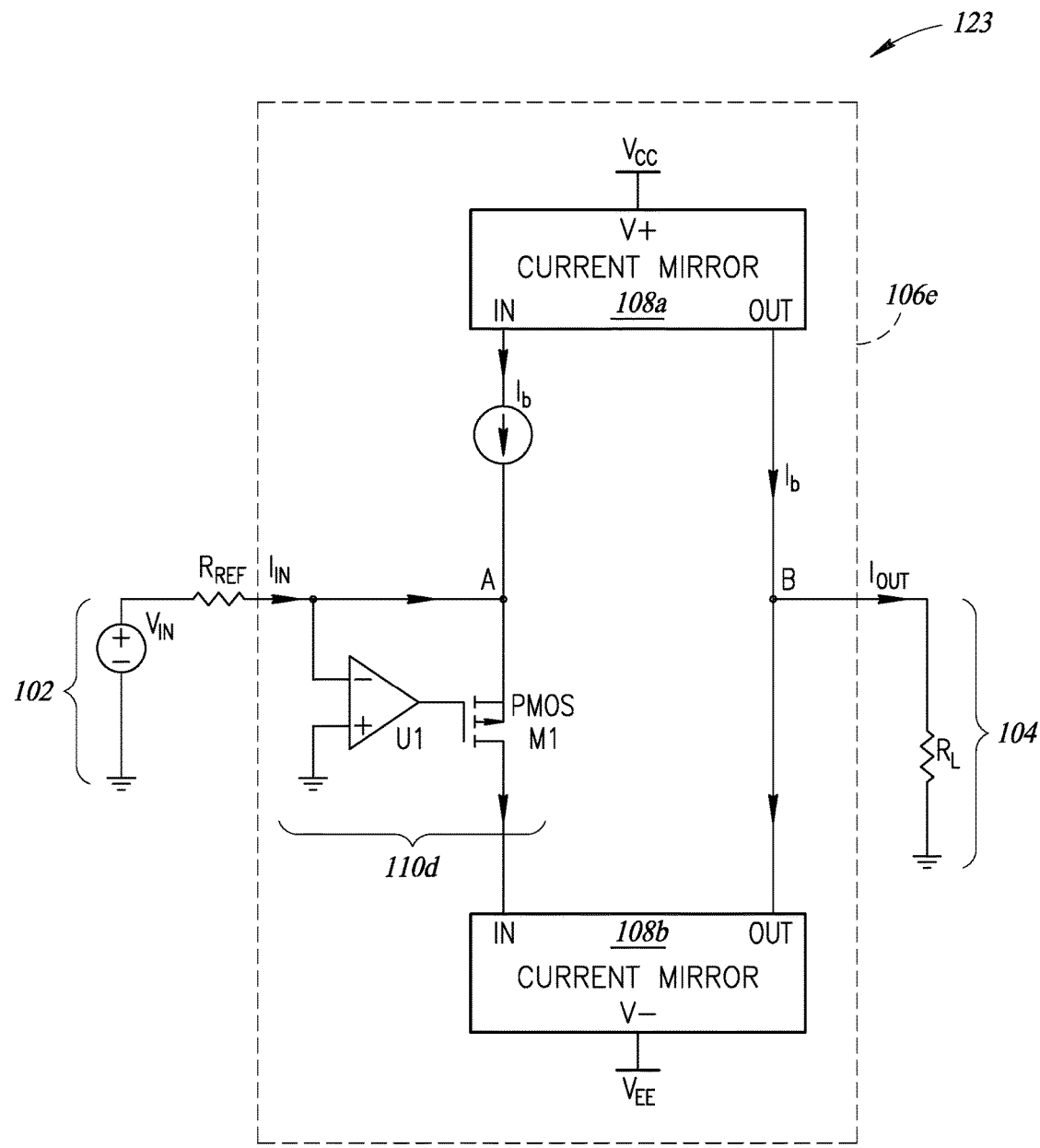
FIG. 8 is a schematic of a transconductance amplifier circuit implemented with a field effect transistor, according to an embodiment as described herein.

FIG. 8 shows a low distortion transconductance amplifier circuit 123, according to an embodiment of the present disclosure. In the low distortion transconductance amplifier circuit 123, the transconductance amplifier 106e, shown enclosed by a dotted line, includes a virtual ground input stage 110d and the two current mirrors 108a, 108b. In the input stage 102, the voltage source V is applied across the precision reference resistor $R_{ref}$ to produce the input current $I_{in}$ at the input node A. The current mirror 108a is coupled to the positive supply voltage $V_{cc}$ and the current mirror 108b is coupled to the negative supply voltage $V_{ee}$. The virtual ground input stage 110d includes the op-amp U1 and a p-type metal-oxide-semiconductor (PMOS) field effect transistor M1, which is a substantially equivalent substitute for the PNP bipolar junction transistor Q1. M1 is particularly suitable for use at lower operating voltages, as is customary in the art. Otherwise, the transconductance amplifier circuit 123 is similar to the transconductance amplifier circuit 115.

Figure 9:
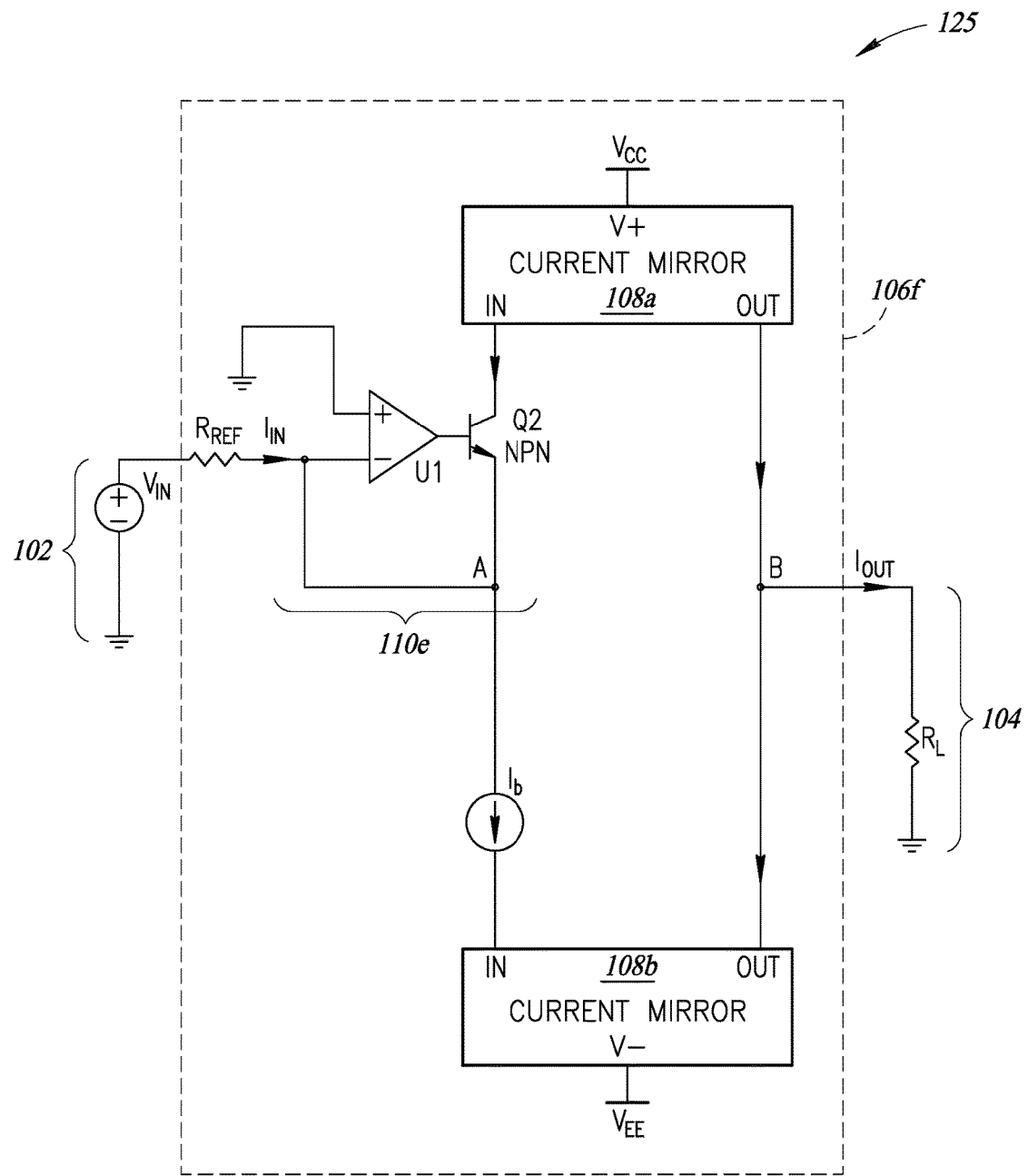
FIG. 9 is a schematic of a transconductance amplifier circuit implemented with a pull input stage, according to an embodiment as described herein.

FIG. 9 shows a low distortion transconductance amplifier circuit 125, according to an embodiment of the present disclosure. In the low distortion transconductance amplifier circuit 125, the transconductance amplifier 106f, shown enclosed by a dotted line, includes a virtual ground input stage 110e and the two current mirrors 108a, 108b. In the input stage 102, the voltage source $V_{in}$ is applied across the precision reference resistor $R_{ref}$ to produce the input current $I_{in}$ at the input node A. The current mirror 108a is coupled to the positive supply voltage $V_{cc}$ and the current mirror 108b is coupled to the negative supply voltage $V_{ee}$. The virtual ground input stage 110e includes the op-amp U1 and an NPN transistor Q2. The positive terminal of U1 is grounded and $I_{in}$ is coupled to the negative terminal of U1. However, the node A is below the transistor Q2 instead of above Q2. The input stage shown in FIG. 9 configured with the NPN transistor Q2 pulls current into the output stage 104 instead of pushing the current. Otherwise, the transconductance amplifier circuit 125 is similar to the transconductance amplifier circuit 115.

Figure 10:
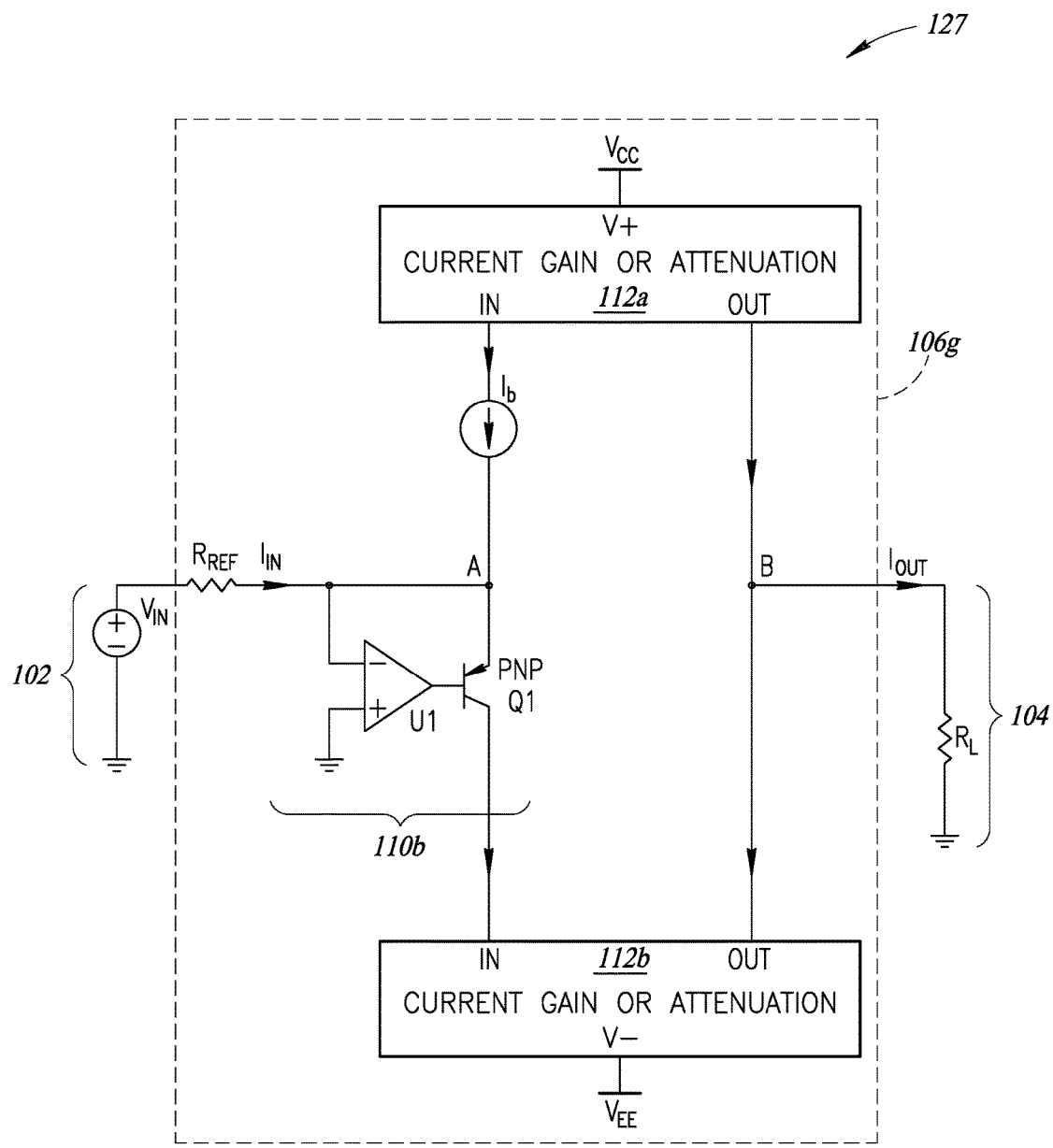
FIG. 10 is a schematic of a transconductance amplifier circuit implemented with current gain or attenuation mirrors, according to an embodiment as described herein.

FIG. 10 shows a low distortion transconductance amplifier circuit 127, according to an embodiment of the present disclosure. In the low distortion transconductance amplifier circuit 127, the transconductance amplifier 106g, shown enclosed by a dotted line, includes the virtual ground input stage 110b and the two current mirrors 112a, 112b. In the input stage 102, the voltage source $V_{in}$ is applied across the precision reference resistor $R_{ref}$ to produce the input current $I_{in}$ at the input node A. The current mirror 112a is coupled to the positive supply voltage $V_{cc}$ and the current mirror 112b is coupled to the negative supply voltage $V_{ee}$. The current mirrors 112a,b are current gain or current attenuation blocks that permit the signal level to be changed. The gain/attenuation blocks function in a similar way as the current mirrors 108, except that they output a current equal to a constant multiplied by the input current. $I_{out}/I_{in}<1$ for a current attenuation block, and $I_{out}/I_{in}>1$ for a current gain block. In contrast, the current mirrors 108a,b have an effective unity current gain. The virtual ground input stage 110b includes the op-amp U1 and the PNP transistor Q1 as in the transconductance amplifier circuit 115.

Figure 11:
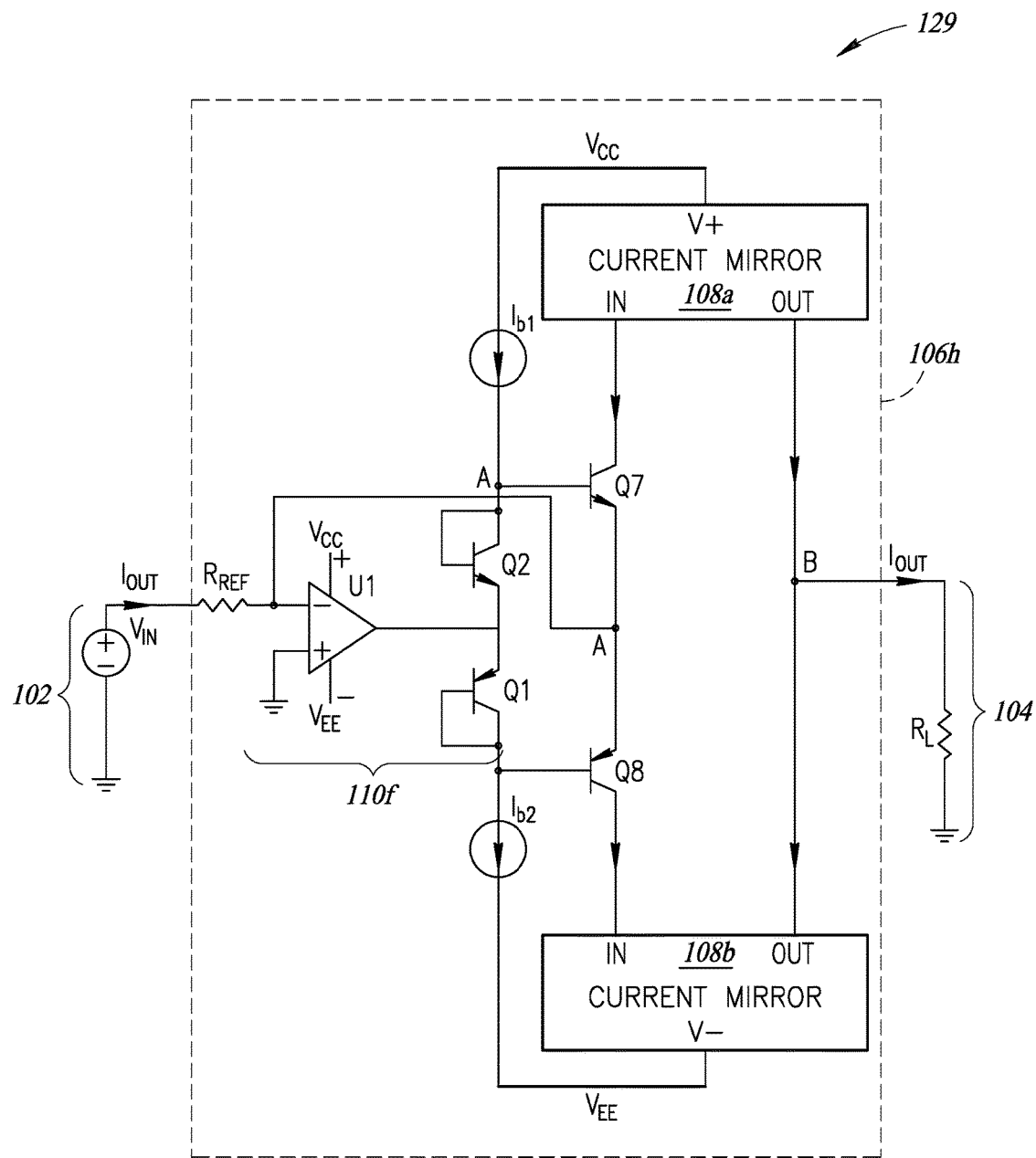
FIG. 11 is a schematic of a class B transconductance amplifier circuit, according to an embodiment as described herein.

FIG. 11 shows a class B low distortion transconductance amplifier circuit 129, according to an embodiment. In the class B transconductance amplifier circuit 129, the transconductance amplifier 106h, shown enclosed by a dotted line, includes the two current mirrors 108a, 108b and a virtual ground input stage 110f. In the input stage 102, the voltage source $V_{in}$ is applied across the precision reference resistor $R_{ref}$ to produce the input current $I_{in}$ at the input node A. In at least one example, the reference resistor $R_{ref}$ has a value of 1 kΩ. The current mirror 108a is coupled to the positive supply voltage $V_{cc}$ and the current mirror 108b is coupled to the negative supply voltage $V_{ee}$. The virtual ground input stage 110f includes the op-amp U1 and the PNP transistors Q1, Q2. However, unlike the Darlington pair embodiment shown in FIGS. 6 and 7, Q1 and Q2 are coupled in series and the base of each transistor is coupled to the collector. The bias current source $I_b$ is coupled to $V_{cc}$ and a second bias current source $I_{b2}$ is coupled to $V_{ee}$. In addition, transistors Q7 and Q8 are coupled to the current mirrors 108a, 108b respectively. In other embodiments, the low distortion transconductance amplifier circuit 129 can feature a linear transconductance amplifier as a class A, class B, or a hybrid class AB amplifier.

Figure 12:
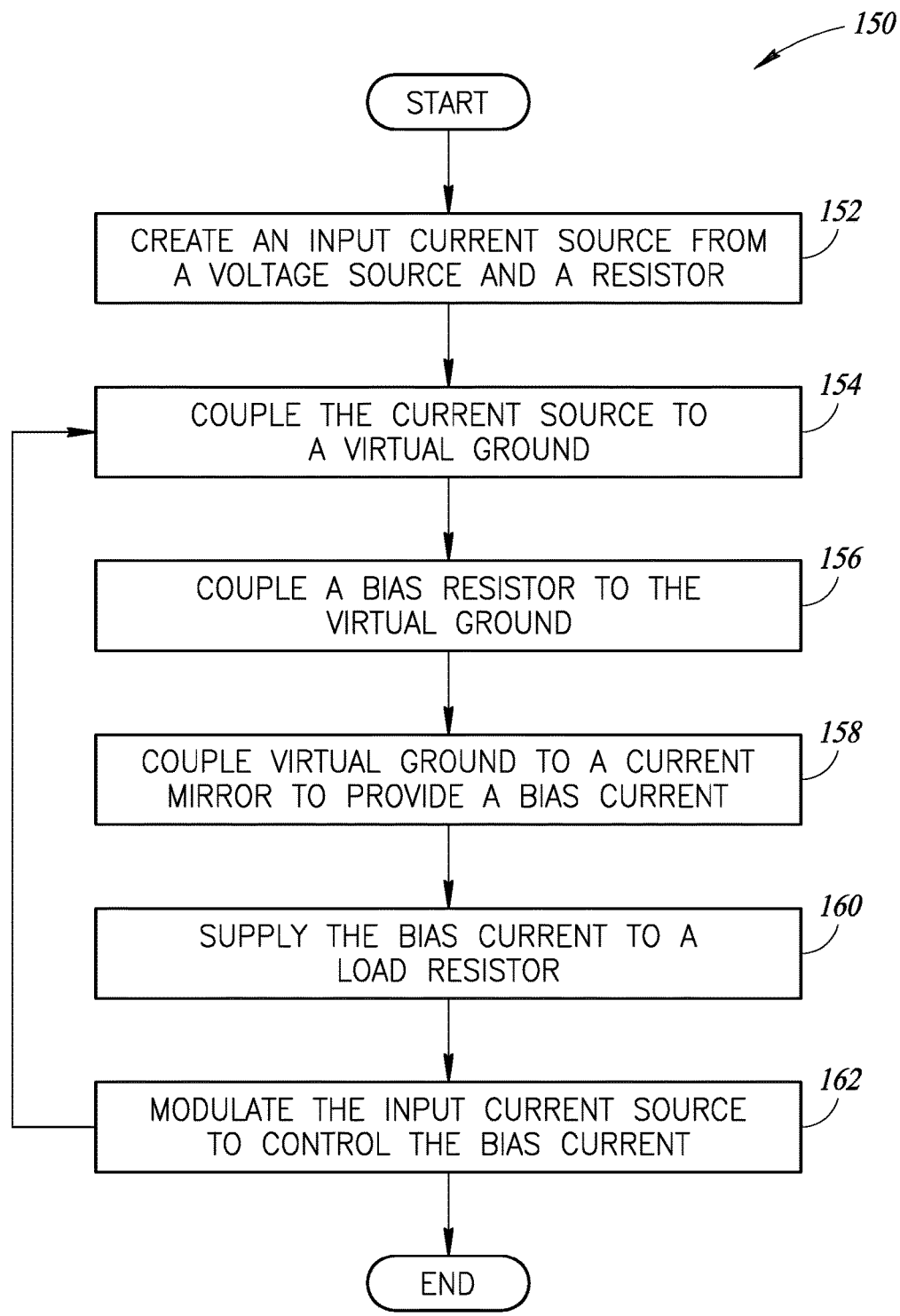
FIG. 12 is a flow diagram illustrating a method of operating a transconductance amplifier circuit, according to an embodiment as described herein.

FIG. 12 shows steps in a method 150 of operating the low distortion transconductance circuits described above, according to an embodiment of the present disclosure.

At 152, an input current source is created from an input voltage source $V_{in}$ and a reference resistor $R_{ref}$.

At 154, the input current source is coupled to a virtual ground.

At 156, a bias resistor is coupled to the virtual ground,

At 158, the virtual ground is coupled to a current mirror to provide a bias current source $I_b$.

At 160, the bias current $I_b$ is supplied to the load resistor $R_L$.

At 162, the input current source $I_{in}$ is modulated to control the bias current $I_b$.

It will be appreciated that, although specific embodiments of the present disclosure are described herein for purposes of illustration, various modifications may be made without departing from the spirit and scope of the present disclosure. The various embodiments described above can be combined to provide further embodiments. Aspects of the embodiments can be modified, if necessary to employ concepts of various other patents, patent applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
   a voltage source;
   a reference resistor coupled to the voltage source;
   an input stage including
      an operational amplifier coupled to the reference resistor;
      a first transistor and a second transistor arranged with the first transistor as a Darlington pair, the first transistor being coupled to be driven by the operational amplifier; and
      a bias current source coupled to the Darlington pair and the operational amplifier;
   an output stage including a grounded load resistor; and
   a pair of current mirrors, each current mirror coupling the input stage to the output stage, wherein the Darlington pair connects the input stage to the pair of current mirrors.

2. The circuit of claim 1 wherein one or more of the current mirrors further includes first and second arrays of bipolar junction transistors.

3. The circuit of claim 2 wherein a current supplied to the output stage is equal to a difference in bias currents of the first and second arrays of the current mirror.

4. The circuit of claim 1 wherein the first and second transistors arranged as the Darlington pair collectively have unity gain.

5. The circuit of claim 1 wherein a positive terminal of the operational amplifier is grounded and the operational amplifier is configured to provide a virtual ground at a negative input terminal of the operational amplifier.

6. The circuit of claim 1 wherein the first transistor coupled to be driven by the operational amplifier is a bipolar junction transistor.

7. The circuit of claim 1 wherein the first transistor coupled to be driven by the operational amplifier is a field effect transistor.

8. The circuit of claim 1 wherein the input stage is a pull input stage that pulls current into the load resistor.

9. The circuit of claim 1 wherein the pair of current mirrors is a pair of current attenuation mirrors.

10. The circuit of claim 1 wherein the pair of current mirrors is a pair of current gain mirrors.

11. The circuit of claim 1 wherein the circuit includes a linear transconductance amplifier.

12. A circuit, comprising:
   a current source;
   a transconductance amplifier coupled to the current source, the transconductance amplifier having a virtual ground input stage, wherein the virtual ground input stage includes two bipolar junction transistors arranged as a Darlington pair; and an output stage coupled to the transconductance amplifier, the output stage having a grounded load.

13. The circuit of claim 12, further comprising a pair of current mirrors coupled between the virtual ground input stage and the output stage.

14. A circuit, comprising:
a first voltage source;
a reference resistor coupled to the first voltage source;
an input stage including
   an operational amplifier coupled to the reference resistor, the operational amplifier having input terminals that are coupled directly to second and third voltage sources, respectively;
   a transistor coupled to be driven by the operational amplifier; and
   a bias current source coupled to the transistor and the operational amplifier;
an output stage including a grounded load resistor; and
a pair of current mirrors, each current mirror coupling the input stage to the output stage.

15. The circuit of claim 14 wherein one or more of the pair of current mirrors further includes first and second arrays of bipolar junction transistors.

16. The circuit of claim 15, wherein a current supplied to the output stage is equal to a difference in bias currents of the first and second arrays of the current mirror.

17. The circuit of claim 14, wherein the transistor is a first transistor and further comprises a second transistor arranged with the first transistor as a Darlington pair connecting the input stage to the pair of current mirrors.

18. The circuit of claim 14 wherein a positive terminal of the operational amplifier is grounded and the operational amplifier is configured to provide a virtual ground at a negative input terminal of the operational amplifier.

19. A transconductance amplifier, comprising:
an input stage including:
   an amplifier having a first input, a second input, and an output, wherein the first input is coupled to a voltage input node of the transconductance amplifier; and
   a transistor having a first conduction terminal coupled to the voltage input node, a control terminal coupled to the output of the amplifier, and a second conduction terminal;
a first current mirror stage including first, second, third, and fourth transistors, wherein:
   the first transistor has a first conduction terminal coupled to a positive voltage supply node, a second conduction terminal coupled to a first intermediary node, and a control terminal coupled to a second intermediary node;
   the second transistor has a first conduction terminal coupled to the first intermediary node, and a second conduction terminal and a control terminal that are cross-coupled and together coupled, via a current source, to the voltage input node;
   the third transistor has a first conduction terminal coupled to the positive voltage supply node, and a second conduction terminal and a control terminal that are cross-coupled and together coupled to the second intermediary node; and
   the fourth transistor has a first conduction terminal coupled to the second intermediary node, a second conduction terminal coupled to a current output node of the transconductance amplifier, and a control terminal coupled to the control terminal of the second transistor; and
a second current mirror stage including first, second, third, and fourth transistors, wherein:
   the first transistor has a first conduction terminal and a control terminal that are cross-coupled and together coupled to the second conduction terminal of the transistor of the input stage, and a second conduction terminal coupled to a third intermediary node;
   the second transistor has a first conduction terminal coupled to the third intermediary node, a second conduction terminal coupled to a negative voltage supply node, and a control terminal coupled to a fourth intermediary node;
   the third transistor has a first conduction terminal coupled to the current output node of the transconductance amplifier, a second conduction terminal coupled to the fourth intermediary node, and a control terminal coupled to the control terminal of the first transistor of the second current mirror stage; and
   the fourth transistor has a first conduction terminal and a control terminal that are cross-coupled and together coupled to the fourth intermediary node, and a second conduction terminal coupled to the negative voltage supply node.

20. The transconductance amplifier of claim 19, wherein the transistor of the input stage is a first transistor, and wherein the input stage further comprises a second transistor arranged with the first transistor as a Darlington pair connecting the input stage to the first and second current mirror stages.

21. The transconductance amplifier of claim 20, wherein the first and second transistors arranged as the Darlington pair collectively have unity gain.

22. The transconductance amplifier of claim 20, wherein the second input of the amplifier is grounded.

23. The transconductance amplifier of claim 22, wherein the second input of the amplifier is an inverting input and is grounded to a virtual ground.

* * * * *